United States Patent [19]

Blondeau et al.

[11] Patent Number: 5,033,816

[45] Date of Patent: Jul. 23, 1991

[54] METHOD FOR MAKING A DIFFRACTION LATTICE ON A SEMICONDUCTOR MATERIAL

[75] Inventors: Robert Blondeau, Ablis; Daniel Rondi, Paris; Anne Taineau, St. Cloud; Gervaise Vilain, Antony; Baudouin de Cremoux, Orsay, all of France

[73] Assignee: Thomson-CSF, Paris, France

[21] Appl. No.: 284,611

[22] Filed: Dec. 15, 1988

[30] Foreign Application Priority Data

Dec. 18, 1987 [FR] France ................... 87 17707

[51] Int. Cl.[5] .............. C02B 5/18; C25F 3/12
[52] U.S. Cl. ................. 350/162.22; 350/162.17; 350/320
[58] Field of Search .............. 350/162.11, 162.17, 350/320, 162.2, 162.22; 372/7, 43; 156/625

[56] References Cited

U.S. PATENT DOCUMENTS

| 4,401,367 | 8/1983 | Grantham et al. | 350/162.22 |
| 4,403,827 | 9/1983 | Bryan et al. | 350/162.17 |
| 4,656,636 | 4/1987 | Amann et al. | 372/50 |

FOREIGN PATENT DOCUMENTS

| 217627 | 4/1987 | European Pat. Off. | |
| 60-196701 | 10/1985 | Japan | 350/162.17 |
| 60-247986 | 12/1985 | Japan | 372/43 |
| 62-147791 | 7/1987 | Japan | 372/43 |
| 62-266889 | 11/1987 | Japan | 372/43 |

OTHER PUBLICATIONS

Patent Abstracts of Japan, vol. 10, No. 329 (E-452) [2385], Nov. 8, 1986.
Patent Abstracts of Japan, vol. 2, No. 22 (E-13), Feb. 14, 1978, p. 11453 E 77.
Patent Abstracts of Japan, vol. 9, No. 291 (E-359) [2014], Nov. 19, 1985.
Patent Abstracts of Japan, vol. 9, No. 47 (E-299) [1770], Feb. 27, 1985.

Primary Examiner—Bruce Y. Arnold
Assistant Examiner—David R. Parsons
Attorney, Agent, or Firm—Oblon, Spivak, McClelland, Maier & Neustadt

[57] ABSTRACT

The method consists of the following successive steps: the deposition on a substrate, by epitaxy, of an optical confinement layer, formed by a first semiconducting material; the deposition, by epitaxy of an active layer, formed by a second semiconducting material; the deposition, by epitaxy, of a stop layer, formed by a third semiconducting material, with a thickness of between 0.005 and 0.02 microns; the deposition, by epitaxy, of a guide layer, formed by a fourth semiconducting material, with a thickness of between 0.01 and 0.03 microns; the deposition of a layer of photosensitive resin, and the cutting out of this layer in a shape to be given to the diffraction lattice which is to be made; the attacking of the guide layer by means of a selective, chemical agent which attacks neither the material of the stop layer nor the resin, this chemical agent being allowed to act until the entire thickness of the guide layer has been gone through, said thickness being chosen to be equal to the depth required for the diffraction lattice.

2 Claims, 4 Drawing Sheets

METHOD FOR MAKING A DIFFRACTION LATTICE ON A SEMICONDUCTOR MATERIAL

BACKGROUND OF THE INVENTION

1. Field of the Invention

The invention concerns a method for making a diffraction lattice on a semiconducting material.

2. Description of the Prior Art

There are known ways to make semiconducting lasers having diffraction lattices. These are Distributed Feed Back (DFB) lasers or Distributed Brag Reflector (DBR) lasers. These lasers are very valuable because of their purity and spectral stability, especially for applications in long-distance telecommunications and in coherent links. Moreover, the structure of these lasers makes them particularly suited to integration, as the presence of the diffraction lattice makes it possible to get rid of at least one of the cleaved faces forming the Perrot-Fabry cavity in a standard laser. These structures can therefore be used to simplify the optical connections with other opto-electronic elements such as modulators, photodiodes, multiplexers, etc.

However, prior art methods for making a diffraction lattice on a semiconducting material are difficult to implement, and it is very difficult to control the characteristics of the lattice. The making of a diffraction lattice is the most difficult step in the making of lasers of this type. Moreover, it is desirable to improve the optical efficiency of this type of lattice.

For example, a DFB laser has at least:

one optical confinement layer, epitaxially grown on a substrate;

an active layer;

a layer, called a guide layer, on which a diffraction lattice is etched.

The standard way to etch a diffraction lattice is to deposit a layer of photosensitive resin on the guide layer, then cut out a mask in the resin, either by UV holography or by electronic masking, and then subject the guide layer to attack by a chemical agent which removes a part of its thickness in the places which are not shielded by the resin mask. It is shown that, to have high efficiency in the manufacture of DFB lasers, a well-determined etching depth of about 0.04 microns should be obtained. The width of the raised parts should be between 0.05 and 0.15 microns. The lattice pitch is about 0.47 microns: this means that the width of the resin strips forming the mask should be at least about 0.15 microns. It is very difficult, with the standard chemical attacking technique, to obtain precise and homogeneous etching depth throughout the surface of the lattice. An object of the invention is a simple method, with high manufacturing efficiency, to make diffraction lattices of this type on a semiconducting material.

SUMMARY OF THE INVENTION

An object of the invention is a method essentially consisting in the deposition, by epitaxy, before the guide layer, of a layer of material which is different from the material forming the guide layer, and then in its etching by a selective chemical attacking process, the depth of the attack in the layer being equal to the thickness itself of this layer.

The lattices made by the method according to the invention give greater optical efficiency than those made according to the prior art.

According to the invention, a method for making a diffraction lattice on a semiconducting material consists of the following successive steps:

the deposition, by epitaxy, of a first layer, called a stop layer, formed by a first semiconducting material and having a thickness of between 0.005 and 0.02 microns;

the deposition, by epitaxy, of a second layer, formed by a second semiconducting material, with a different composition from that of the first layer, with a thickness between 0.01 and 0.03 microns, which is equal to the depth of the lines of the lattice to be made;

the deposition of a mask having the form to be given to the diffraction lattice that is to be made;

the chemical attacking of the second layer, through the mask, by means of a selective chemical agent which does not attack the material of the first layer, this chemical agent being allowed to act until it has gone through the entire thickness of the second layer;

the removal of the mask.

DETAILED DESCRIPTION OF PREFERRED EMBODIMENTS

Figure 1:
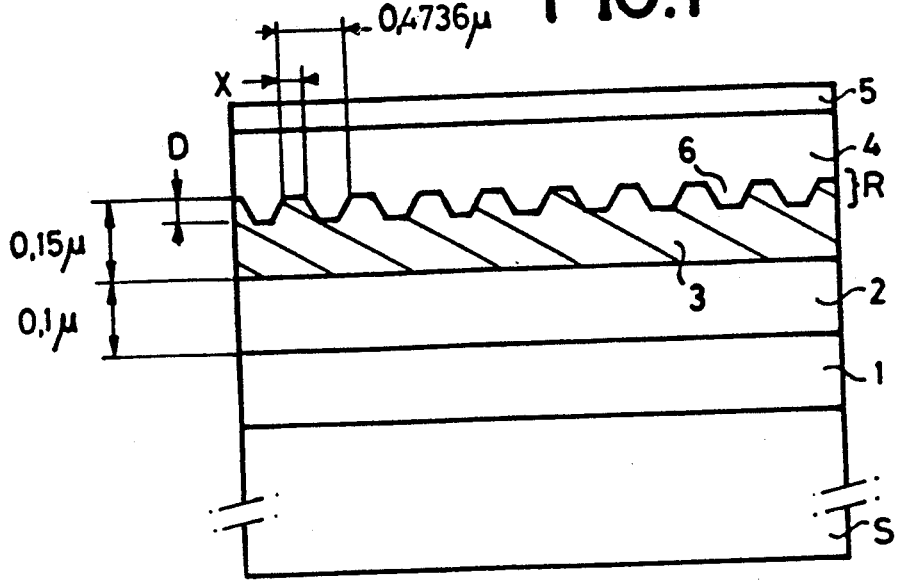
FIG. 1 shows an optical device having a diffraction lattice made according to the prior art.

FIG. 1 shows a section of the structure of an DFB laser, emitting at a wavelength of 1.55 microns and having a diffraction lattice R made according to the known method. It has the following in succession: a substrate S, an optical confinement layer 1, epitaxially grown on the substrate S and formed by InP; an active layer 2 formed by GaInAsP, having a bandgap width corresponding to a wavelength of 1.5 microns and having a thickness of 0.1 microns; a guide layer 3 on which is etched the lattice R with a depth D smaller than the thickness of the layer 3, which is 1.5 microns, the layer 3 being formed by GaInAsP, with a bandgap width which is greater than that of the layer 2, corresponding, for example, to a wavelength of 1.3 microns; an optical confinement layer 4, epitaxially grown on the layer 3 after the lattice R has been etched on this laser 3; and a contact layer 5.

The lattice R consists of mutually parallel lines with a pitch of 0.4736 microns and the width of the raised part, forming each line has a value X. It is shown that, to obtain high efficiency in the manufacture of DFB lasers, independently of the problem of obtaining uniformity in the thickness and composition of the layers, it is necessary to obtain a diffraction lattice with a coupling factor, K.L, between the values 1 and 2, K being a coupling coefficient and L being the length of the laser, generally of the order of 300 microns.

Figure 2:
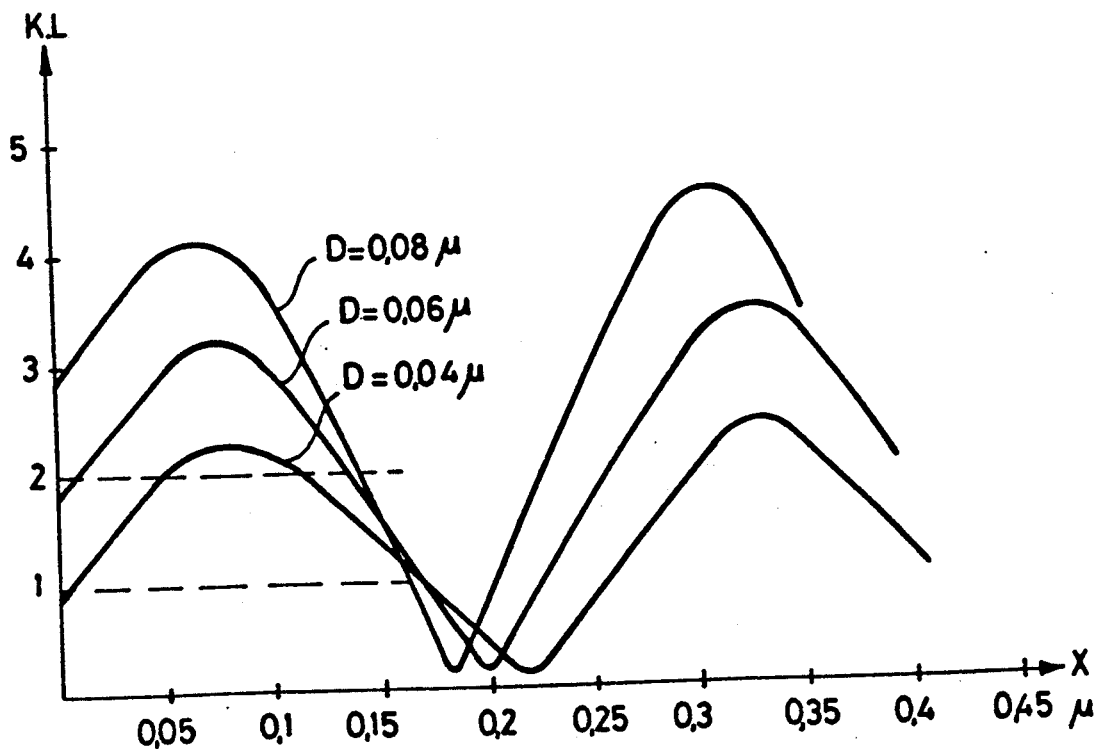
FIG. 2 shows a graph illustrating the need to make an etching that has a precise depth.

FIG. 2 shows a graph giving the value of the coupling factor K.L of the lattice, as a function of the width L of the raised parts forming the lines of the lattice, and as a function of the depth D of the etchings. The slope of the raised parts is assumed to make an angle of 54° C. with the plane of the layers. This graph is plotted for a second-order lattice.

It would appear from this graph that it is necessary to obtain a small etching depth D, of about 0.4 microns, and that the width X of the raised parts should be between 0.05 and 0.15 microns, so that the coupling factor K.L ranges between 1 and 2. Since the pitch of the lattice is 0.4736 microns, this implies that the resin strips forming the etching masks have a constant width of about 0.15 microns. With the standard method, it is hard to obtain an etching depth and width of this type with precision, uniformity and reproducibility. The manufacturing efficiency is thus quite low. On the contrary, the method according to the invention gives both high manufacturing efficiency and high optical efficiency.

Figure 3:
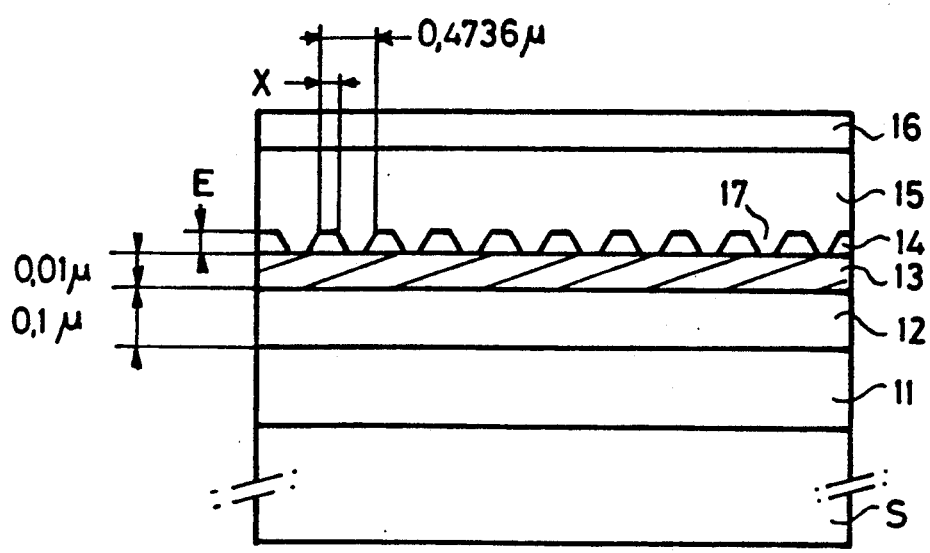
FIG. 3 shows an optical device having a diffraction lattice achieved by the method according to the invention.

FIG. 3 shows a section of the structure of a DFB laser with a lattice made by the method according to the invention. Its making consists of the following steps in succession:

the deposition, by epitaxy, on a substrate S, of an optical confinement layer 11, formed by InP;

the deposition, by epitaxy, of an active layer 12 formed by GaInAsP, with a bandgap width equal to 1.5 microns and a thickness of 0.1 microns;

the deposition, by epitaxy, of a layer 13, called a stop layer, formed by InP and having a bandgap width corresponding to a wavelength of 0.2 microns and a thickness of 0.01 microns;

the deposition, by epitaxy, of a guide layer 14 formed by GaInAsP with a bandgap width corresponding to a wavelength of 1.5 microns and a thickness E.

the deposition of a layer of photosensitive resin and the cutting out of this layer according to the shape to be given to the diffraction lattice, by UV holography or by electronic masking, according to a standard procedure for making a mask by means of a photosensitive resin;

the attacking of the guide layer 14 by means of a selective chemical agent which attacks neither the material InP of the stop layer 13 nor the resin;

letting this chemical agent act until the entire thickness of the guide layer 14 has been removed at those places which are not shielded by the resin, the thickness E of the layer 14 being chosen to be equal to the thickness desired for the diffraction lattice;

the removal of the resin layer by a standard chemical solvent;

the deposition, by epitaxy, of the optical confinement layer 15;

the deposition, by epitaxy, of a contact layer 16.

This method can be used to obtain a precise and uniform etching depth for it is determined by the thickness E of the layer 14. This thickness is deposited uniformly and precisely by means of modern epitaxial techniques such as MBE (molecular beam expitaxy) or MOCVD (metal organic chemical vapor deposition). These techniques enable the growing of thin layers, having thicknesses ranging from a few thousandths of a micron to a few microns and being formed by materials of different natures and different compositions with great homogeneity and excellent reproducibility. The known techniques of selective chemical attacking, for their part, enable the etching of a pattern on a layer of semiconducting material, with the certainty of not damaging neighboring layers that have different compositions.

Since the etching depth is fixed by the thickness E of the layer 14, it is far easier to subsequently have control over the width of the grooves 17 to obtain a precise and uniform width X of the raised parts. The only constraint imposed by this method lies in the use, for the layer 14, of a material different from that of the layer 13, which is intended to stop the chemical attack. The material of the layer 14 may, if necessary, be the same as that of the active material 12, thus simplifying the epitaxial operations. In a certain optical device, the layer 14, after etching of the lattice, may form a guiding structure of the strip type as shall be mentioned further below.

Figure 4:
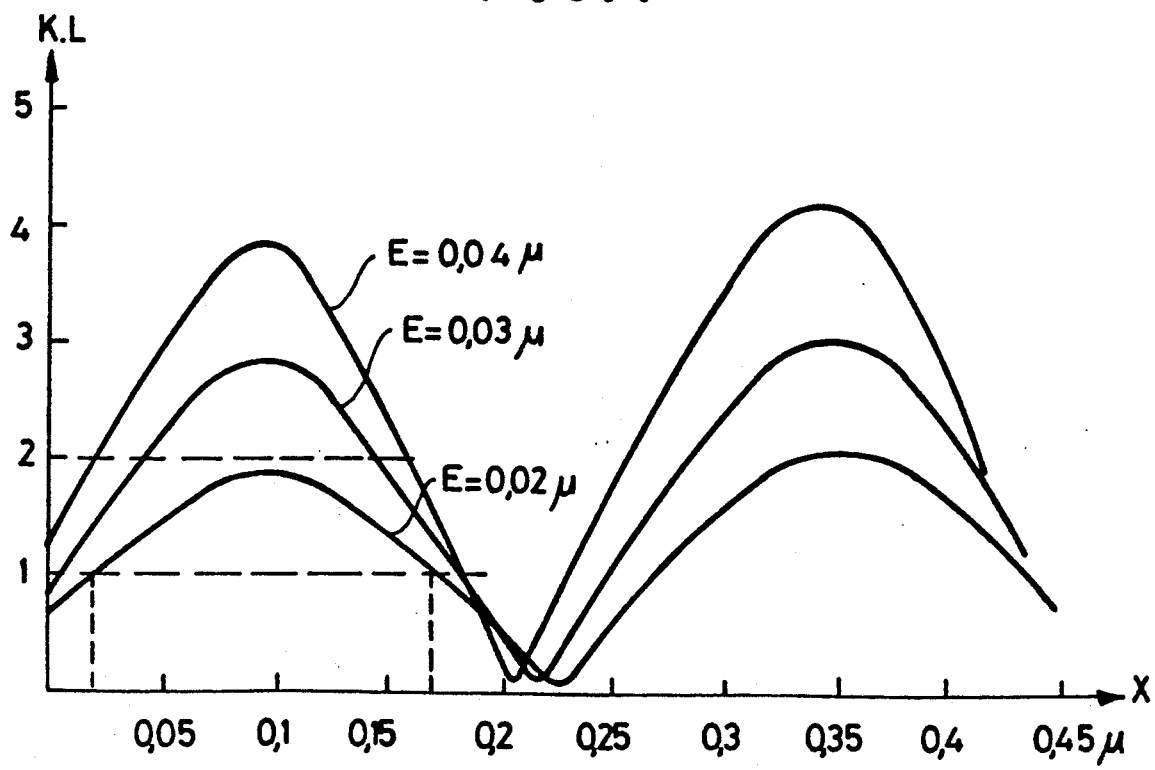
FIG. 4 shows a graph illustrating the possibility of obtaining high efficiency in the manufacture of DFB lasers, in applying the method according to the invention.

FIG. 4 shows a graph giving the value of the coupling factor K.L as a function of the width X of the raised parts left by the etching process and as a function of the thickness E of the layer 14 which is etched. These graphs are plotted for a laser structure such as the one described above, emitting at a wavelength of 1.55 microns, with a second-order lattice. In this graph, it appears that, for a thickness E of the guide layer 14 equal to 0.02 microns, the coupling factor obtained remains between 1 and 2, which is the value sought for a high manufacturing efficiency, when the width X varies from 0.03 microns to 0.18 microns. This width X can be easily controlled by acting on the length of the etching period. Consequently, the value of the coupling factor K.L can be easily controlled. This ease of implementation is a major advantage for the making of opto-electronic components, especially DFB and DBR lasers, or an industrial scale.

Figure 5:
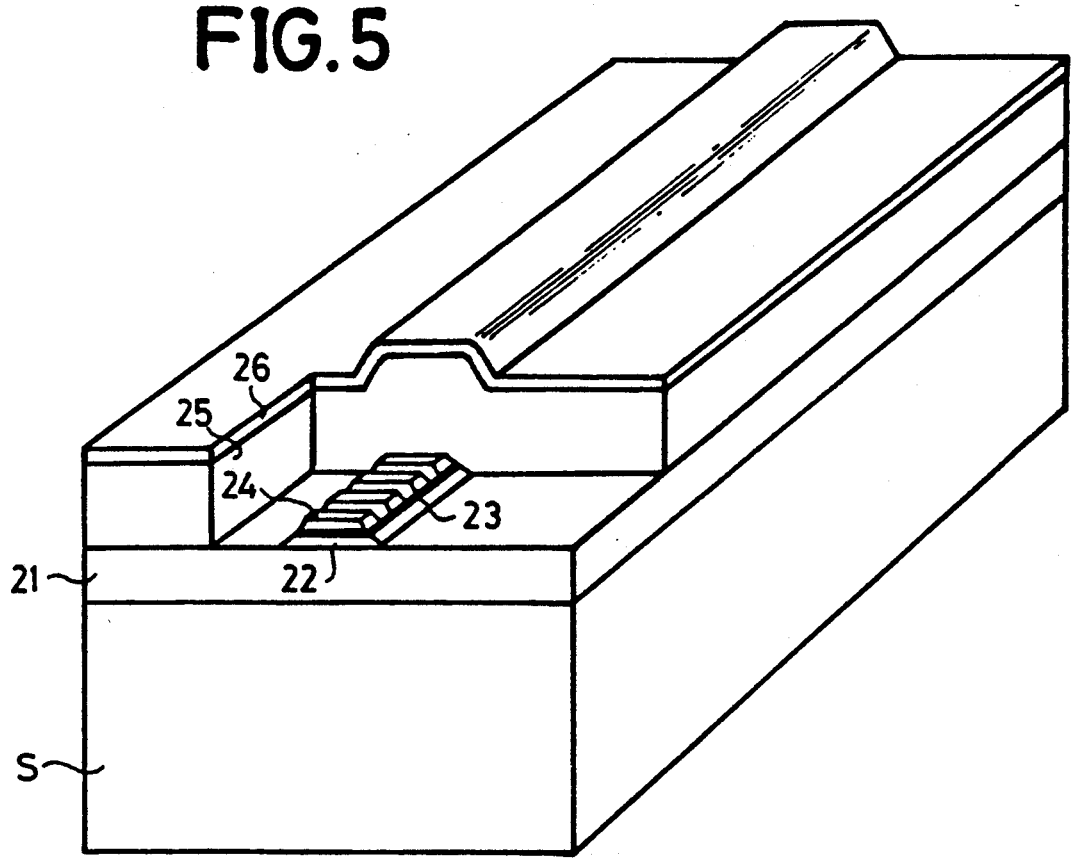
FIGS. 5 and 6 show two DFB laser structures having a diffraction lattice achieved by the method according to the invention.

FIG. 5 shows the structure of a DFB laser with embedded strip, having a lattice made by the method according to the invention. A confinement layer 21, then an active layer 22, then a stop layer 23 and then a guide layer 24 are successively deposited by epitaxy on a substrate S. Then a lattice is etched in the guide layer 24 by means of a first resin mask and a selective chemical attack by the method according to the invention. Then a second resin mask and a non-selective chemical attack are used to cut out the layers 22, 23, and 24 together, in leaving behind a strip, the large axis of which is perpendicular to the lines of the lattice etched in the layer 24. The epitaxy is resumed to deposit a confinement layer 25, and then a contact layer 26 covering both this strip and the unoccupied part of the surface of the layer 21. The injection can be localized in the strip by different techniques: proton implantation, diffusion, blocking layers, etc.

Figure 6:
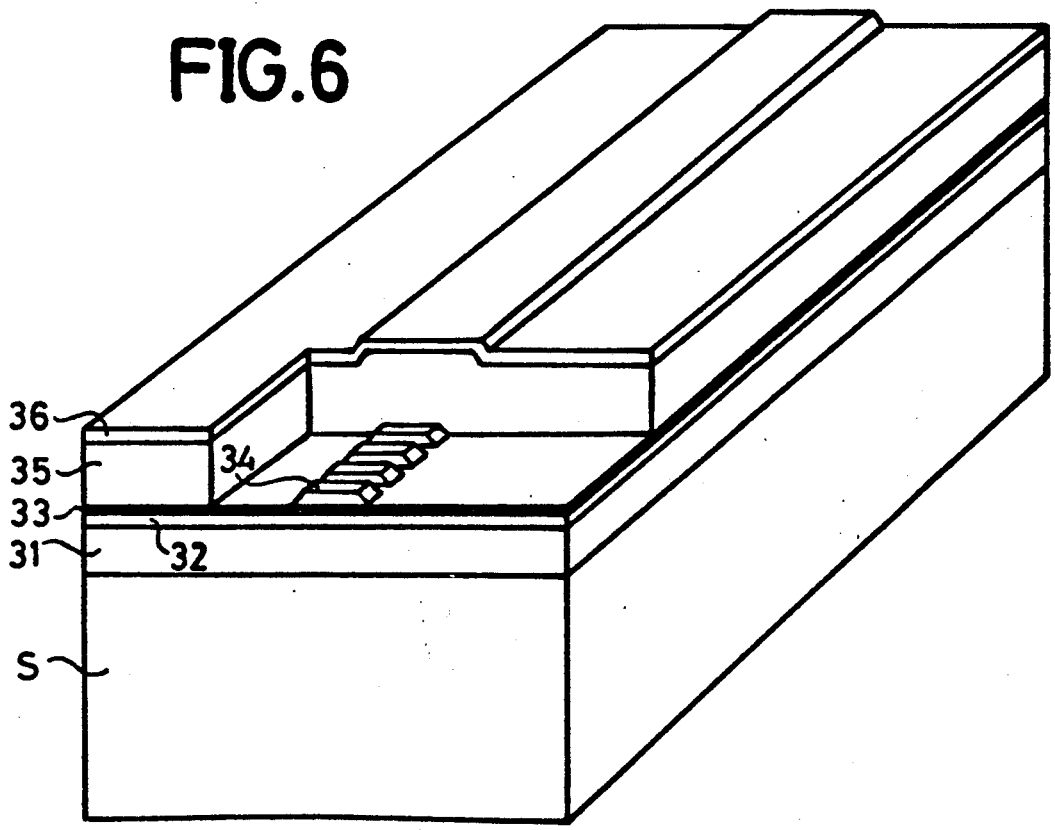

FIG. 6 shows the structure of an embedded strip guide DFB laser made by the method according to the invention. A confinement layer 31, an active layer 32, a stop layer 33 and a guide layer 34 are successively deposited by epitaxy on a substrate S. In the layer 34, a lattice is etched by means of a first resin mask and a first selective chemical attack according to the method described above. Then, by means of a second resin mask and a second selective chemical attack, the layer 34 is etched strip form, with the large axis of the strip being oriented perpendicularly to the lines of the lattice. The active layer 32 and the stop layer 33 retain a width equal to that of the substrate S, with the material of the layer 33 forming a stop layer for the second selective chemical attack too. The layers 31 to 34 form an embedded strip guide. Epitaxy is then resumed to deposit a confinement layer 35 and then a contact layer 36. As in the above case, the injection can be localized by different known techniques. This structure is highly advantageous through the simplicity of its making.

Figure 7:
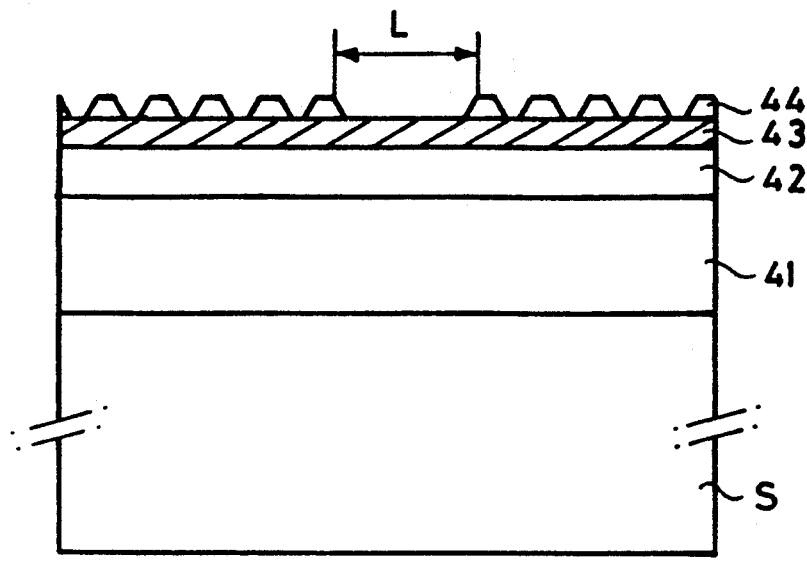
FIGS. 7 and 8 show two optical devices, comprising a phase shifter and a diffraction lattice, achieved by the method according to the invention.
Figure 8:
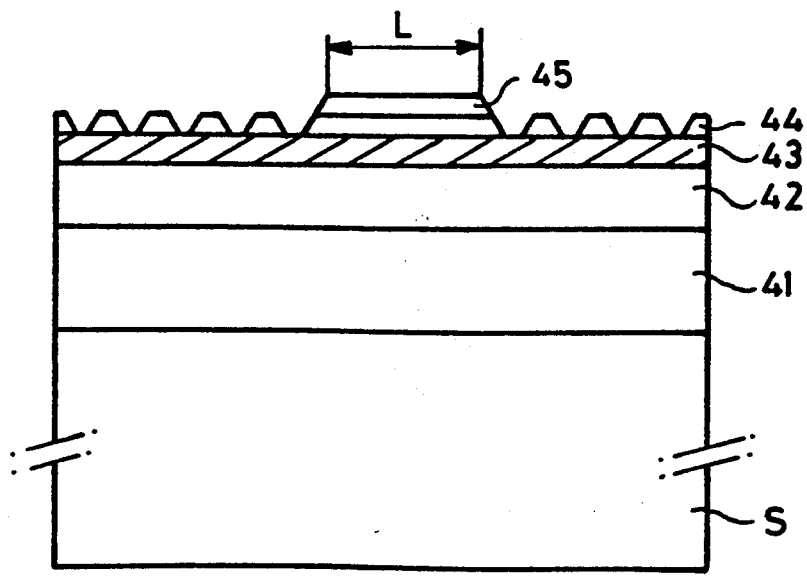

FIGS. 7 and 8 show another type of opto-electronic device, comprising a lattice and a phase shifter. These two devices have a confinement layer 41, an active layer 42, a stop layer 43 and a guide layer 44, deposited by epitaxy on a substrate S. A lattice is etched in the guide layer 44 by the method according to the invention, but the surface of the lattice has two separate parts, separated by a zone with a width L and with its length parallel to the lines of the lattice. The width L determines the phase shift made by the passage of a wave through this zone.

In the exemplary embodiment of FIG. 7, the zone with the width L is one where the layer 44 has been entirely removed by a second selective chemical attack, a second mask being used to shield that part where the lattice has to remain. It is also possible to etch this zone before etching the lattice. The width L determines the phase shift made by the passage of a wave through this zone.

In the example shown in FIG. 8, the phase shift is achieved, on the contrary, by a zone with a width L, where the guide layer 44 is not attacked during the etching of the lattice, because of a shielding layer 45 formed by a semiconducting material which is different from that of the layer 44. A first resin mask and a first selective, chemical attack are used to remove the layer 45, except on a zone forming the strip with a width L, without attacking the layer 44. Then, a second mask and a second chemical attack are used to etch the lattice in the layer 44 without attacking the layer 45 or the layer 43. The layer 44 thus remains intact beneath the strip with the width L, and can be used for lateral guiding. In this example, the layer 45 consists of InP and plays no role in the phase shift. In other embodiments, the layer 45 may consist of a quaternary material and may play a role in the phase shift.

The scope of the invention is not restricted to the above-described embodiments. In particular, the method for making a diffraction lattice can be applied to electro-optical devices, other than devices with guiding structures. Furthermore, it can be applied to devices having several diffraction lattices, etched in superimposed layers. For example, it is possible to envisage the etching of a first diffraction lattice in a guide layer, formed by a quaternary material, deposited on a stop layer formed by a binary material, and then the deposition, on top of the first lattice, of another stop layer consisting of a binary material, and then the deposition of another layer of quaternary material and the etching of a second lattice in this other layer of quaternary material. It is also possible to make a device of this type on the basis of a set of layers formed alternately by binary material and quaternary material with successive, selective, chemical attacks.

The applications of the method according to the invention are not restricted to lasers and integrated couplers. They may be applied to all functions of integrated optics comprising one or more diffraction lattices. The method according to the invention can be applied to numerous groups of semiconducting materials, especially III-V compounds and their solid solutions such as GaInAsP, GaInAs, GaAlAs, GaInAlAs, GaInAsSb, etc.

The guide layer on which the lattice is etched can be formed by several sub-layers of different materials so as to form a multiple quantum well structure.

What is claimed is:

1. A method for making a diffraction lattice on a semiconducting material, consisting of the following successive steps:

the deposition by epitaxy on a substrate of an optical confinement layer;

the deposition by epitaxy of an active layer;

the deposition, by epitaxy, of a first layer, which is a stop layer, formed by a first semiconducting material and having a thickness of between 0.005 and 0.02 microns;

the deposition, by epitaxy, of a second layer, formed by a second semiconducting material, with a different composition from that of the first layer, and with a thickness which is equal to the depth of the lines of the lattice to be made;

the deposition of a mask having the form to be given to the diffraction lattice that is to be made;

the chemical attacking of the second layer, through the mask, by means of a selective chemical agent which does not attack the material of the first layer, this chemical agent being allowed to act until the entire thickness of the second layer has been gone through;

the removal of the mask.

2. A method according to claim 1, wherein the semiconducting material forming the second layer is a quaternary compound, and the semiconducting material forming the first layer is a binary compound.

* * * * *

UNITED STATES PATENT AND TRADEMARK OFFICE
CERTIFICATE OF CORRECTION

PATENT NO. : 5,033,816

DATED : July 23, 1991

INVENTOR(S) : Robert Blondeau et al.

It is certified that error appears in the above-identified patent and that said Letters Patent is hereby corrected as shown below:

Title page item (75):
   The 3rd inventor's name is spelled incorrectly, should be, --Anne Talneau--.

Signed and Sealed this

Twenty-seventh Day of October, 1992

Attest:

DOUGLAS B. COMER

*Attesting Officer*     *Acting Commissioner of Patents and Trademarks*